(12) United States Patent  
Song et al.

(10) Patent No.: US 8,786,180 B2  
(45) Date of Patent: Jul. 22, 2014

(54) DISPLAY DEVICE

(71) Applicant: LG Display Co., Ltd., Seoul (KR)

(72) Inventors: Eunah Song, Gyeonggi-do (KR); Myungseop Kim, Gyeonggi-do (KR); Sunhee Lee, Gyeonggi-do (KR)

(73) Assignee: LC Display Co., Ltd., Seoul (KR)

( * ) Notice: Subject to any disclaimer, the term of this patent is extended or adjusted under 35 U.S.C. 154(b) by 0 days.

(21) Appl. No.: 13/644,845

(22) Filed: Oct. 4, 2012

(65) Prior Publication Data  
US 2013/0082592 A1 Apr. 4, 2013

(30) Foreign Application Priority Data

Oct. 4, 2011 (KR) .......................... 10-2011-0100731  
Dec. 15, 2011 (KR) .......................... 10-2011-0135824

(51) Int. Cl.  
H01L 51/52 (2006.01)

(52) U.S. Cl.  
USPC .......................................................... 313/504

(58) Field of Classification Search  
USPC .................................................... 313/498–512  
See application file for complete search history.

(56) References Cited

U.S. PATENT DOCUMENTS

| | | | |
|---|---|---|---|
| 2004/0056589 A1* | 3/2004 | Yamazaki et al. | 313/506 |
| 2006/0132033 A1* | 6/2006 | Maeda | 313/512 |
| 2009/0021154 A1* | 1/2009 | Aota | 313/504 |
| 2009/0256467 A1* | 10/2009 | Yamazaki et al. | 313/504 |
| 2010/0060150 A1* | 3/2010 | Igarashi | 313/504 |
| 2010/0060158 A1* | 3/2010 | Kase et al. | 313/512 |
| 2012/0032582 A1* | 2/2012 | Chang et al. | 313/504 |

* cited by examiner

Primary Examiner — Donald Raleigh  
(74) Attorney, Agent, or Firm — Morgan, Lewis & Bockius LLP

(57) ABSTRACT

A display device is discussed. According to an embodiment, the display device includes a substrate; a first electrode positioned on the substrate; a second electrode; an organic emission layer interposed between the first electrode and the second electrode; an organic insulating film positioned on the second electrode and surrounding an emission area emitting light from the organic emission layer; and a passivation film covering the organic insulating film.

14 Claims, 11 Drawing Sheets

DISPLAY DEVICE

This application claims the priority benefit of Korean Patent Application NO. 10-2011-0100731 filed on Oct. 4, 2011 and NO. 10-2011-0135824 filed on Dec. 15, 2011, which is incorporated herein by reference for all purposes as if fully set forth herein.

BACKGROUND OF THE INVENTION

1. Field of the Invention

This document relates to a display device, and more particularly, to a display device which prevents penetration of external moisture and oxygen and has an improved lifespan.

2. Discussion of the Related Art

In recent years, various flat panel displays capable of reducing weight and volume which are demerits of a cathode ray tube have been developed. The flat panel displays include a liquid crystal display (LCD), a field emission display (FED), a plasma display panel (PDP), and an organic light emitting display (OLED).

Among the above flat panel displays, the organic light emitting display is a self-emissive display device which electrically excites organic compounds and emits light. The organic light emitting diode does not require a backlight unit, unlike liquid crystal display. Therefore, the organic light emitting display may be fabricated in a lightweight and thin type and by simple processes. In addition, since the organic light emitting display may be fabricated at a low temperature and has characteristics of a fast response speed less than 1 ms, low power consumption, a wide viewing angle, and high contrast.

The organic light emitting display comprises an emission layer between an anode and a cathode. Thus, holes supplied from the anode combine with electrons supplied from the cathode in the organic emission layer to form hole-electron pairs, i.e., excitons. When the excitons transition from an exited state to a ground state, energy is generated so that the organic light emitting diode emits light.

FIG. 1 is a cross-sectional view showing a conventional organic light emitting display, and FIG. 2 is a top plan view showing an organic light emitting display which is shrunken.

Referring to FIG. 1, the conventional organic light emitting display comprises a first electrode 12 formed on a substrate 10, a bank layer 13 formed on the first electrode 12, an organic emission layer 14 formed on the first electrode 12 exposed by the bank layer 13, and a second electrode 12 formed on the organic emission layer 14. A passivation film 17, which covers the elements disposed below it including the second electrode 15, is formed, and an encapsulation substrate 24 encapsulates the substrate 10 through an encapsulating agent 22.

Although the above-described conventional organic light emitting display 10 has the passivation film 17 formed on top of the second electrode 15 to protect the elements disposed below it, an impurity 20 with a large diameter may be attached in the fabrication process of the passivation film 17. In this case, external moisture or oxygen penetrates the organic emission layer 14 through a gap in the passivation film 17 that comes off by the impurity 20. As shown in FIG. 2, the organic emission layer 14 has the problem of shrinkage which degrades the organic emission layer 14 by the penetrating moisture and oxygen and causes it to emit no light.

SUMMARY OF THE INVENTION

An aspect of this document is to provide a display device which prevents penetration of external moisture and oxygen and has an improved lifespan.

In one aspect, there is a display device including, a substrate; a first electrode positioned on the substrate; a second electrode; an organic emission layer interposed between the first electrode and the second electrode; an organic insulating film positioned on the second electrode and surrounding an emission area emitting light from the organic emission layer; and a passivation film covering the organic insulating film.

In another aspect, there is a display device including, a substrate; a first electrode positioned on the substrate; a second electrode; an organic emission layer interposed between the first electrode and the second electrode; a second passivation film positioned on the second electrode; an organic insulating film positioned on the second electrode and surrounding an emission area emitting light from the organic emission layer; and a first passivation film covering the second passivation film and the organic insulating film.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. The terminology used in the description of the invention herein is for the purpose of describing particular embodiments only and is not intended to be limiting of the invention.

Figure 3:
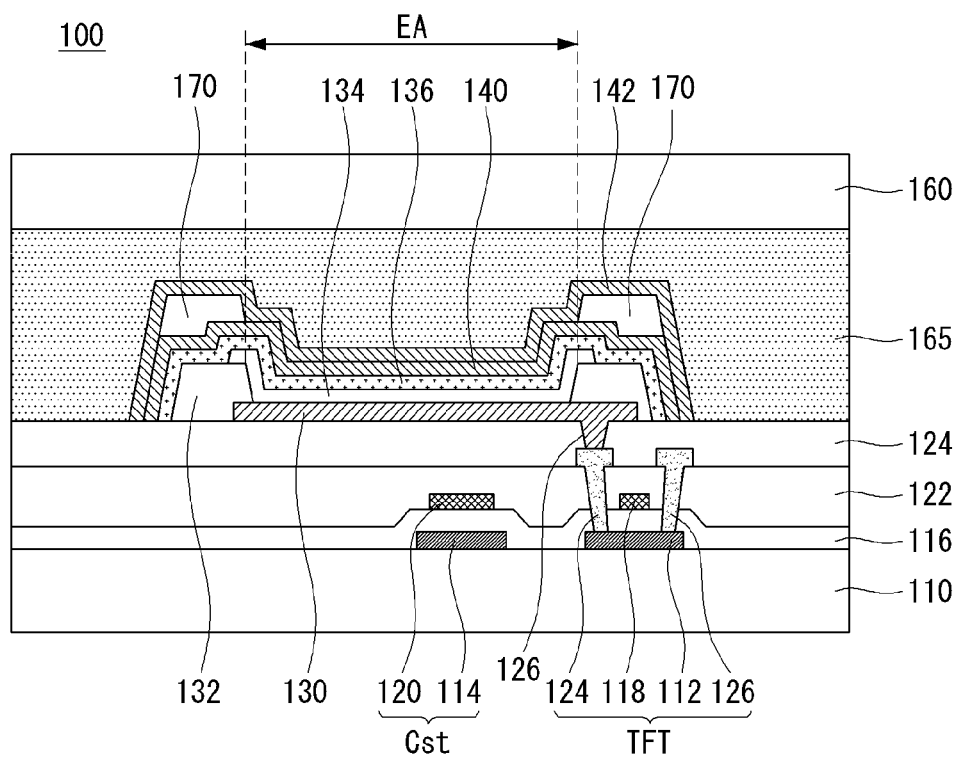
FIG. 3 is a cross-sectional view showing a display device according to a first exemplary embodiment of the present invention.
Figure 4:
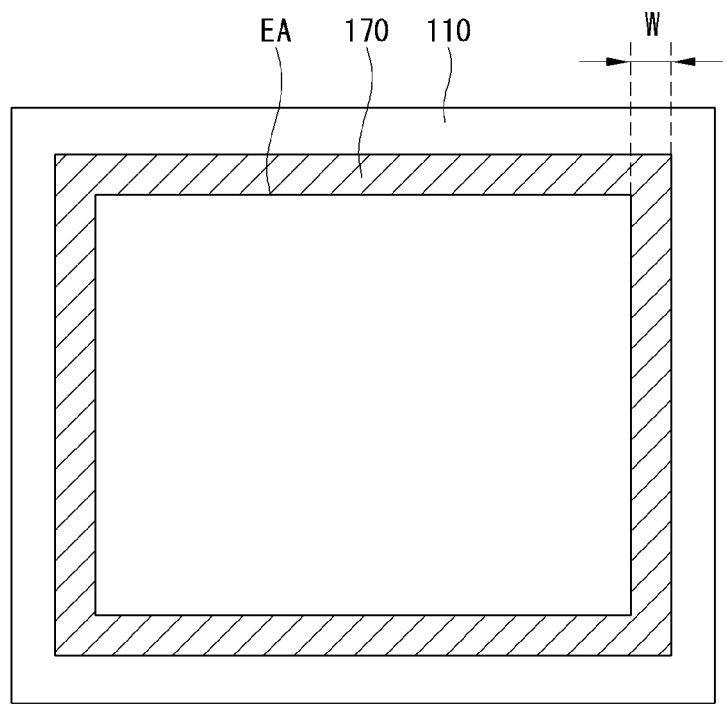
FIG. 4 is a top plan view showing the display device of FIG. 3.
Figure 5:
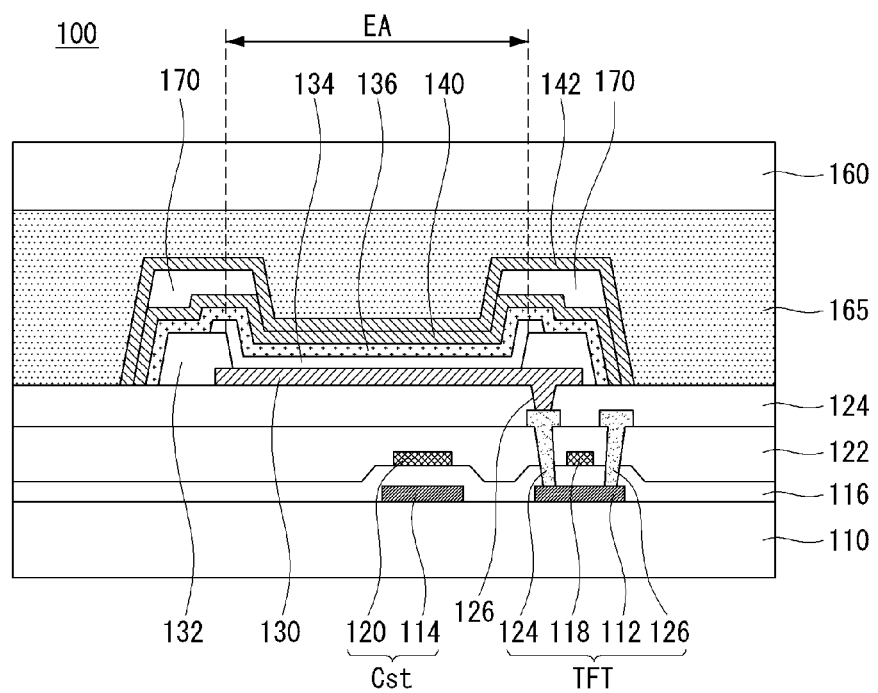
FIG. 5 is a cross-sectional view showing the display device according to the first exemplary embodiment of the present invention.
Figure 6:
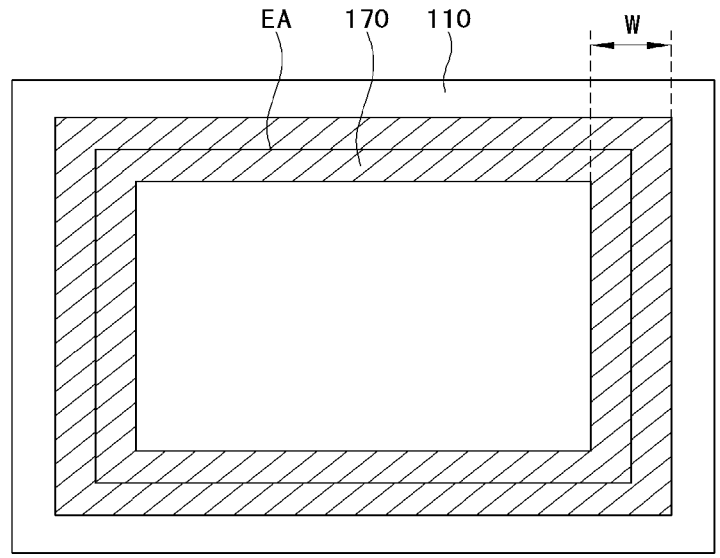
FIG. 6 is a top plan view showing the display device of FIG. 5.

FIGS. 3 and 5 are cross-sectional views showing a display device according to a first exemplary embodiment of the present invention. FIG. 4 is a top plan view showing the display device of FIG. 3. FIG. 6 is a top plan view showing the display device of FIG. 5.

As shown in FIG. 3, the display device 100 according to the first exemplary embodiment comprises a substrate 110, a first electrode 130 positioned on the substrate 110, a second electrode 136, an organic emission layer 134 interposed between the first electrode 130 and the second electrode 136, a second passivation film 140 positioned on the second electrode 136, an organic insulating film 170 positioned on the second passivation film 140 and surrounding an emission area EA emitting light from the organic emission layer 134, and a first passivation film 142 covering the second passivation film 140 and the organic insulating film 170.

More specifically, a thin film transistor TFT and a capacitor Cst positioned on the substrate 110. The thin film transistor TFT comprises a semiconductor layer 112, a gate electrode 118, a source electrode 126 and a drain electrode 124. A gate insulating film 116 is positioned between the semiconductor layer 112 and the gate electrode 118. An interlayer insulating film 122 is positioned between the gate electrode 118, and the source electrode 126 and the drain electrode 124. The capacitor Cst comprises a capacitor lower electrode 114 and a capacitor upper electrode 120, with the gate insulating film 126 interposed therebetween.

Although the first exemplary embodiment of the present invention is illustrated by taking as an example a top-gate type thin film transistor in which the gate electrode 118 is positioned on top of the semiconductor layer 112, the present invention is not limited thereto, but a bottom-gate type thin film transistor in which the gate electrode 118 is positioned below the semiconductor layer 112 is also applicable.

An overcoat layer 124 is positioned on the substrate 110 where the thin film transistor TFT and the capacitor Cst are formed. The overcoat layer 124 protects the thin film transistor TFT and the capacitor Cst, and planarizes steps formed by the thin film transistor TFT.

The first electrode 130 is positioned on the overcoat layer 124. The first electrode 130 is an anode, which may be made of a transparent conductive material having a high work function and causing light to be transmitted therethrough, such as indium tin oxide (ITO), indium zinc oxide (IZO), indium cerium oxide (ICO), or zinc oxide (ZnO). The first electrode 130 is electrically connected to the drain electrode 124 of the thin film transistor TFT through a via hole 126 penetrating through the overcoat layer 124 exposing the drain electrode 124 of the thin film transistor TFT.

The bank layer 132 is positioned on the first electrode 130. The bank layer 132 may be a pixel defining film that exposes part of the first electrode 130 and defines a pixel. The organic emission layer 134 is positioned on the bank layer 132 and the exposed first electrode 130. The organic emission layer 134 is a layer which emits light by recombination of electrons and holes. A hole injection layer or hole transport layer may be included between the organic emission layer 134 and the first electrode 130, and an electron transport layer or electron injection layer may be included on the organic emission layer 134.

The second electrode 136 is positioned on the substrate 110 where the organic emission layer 134 is formed. The second electrode 136 is a cathode made of magnesium Mg, calcium, Ca, aluminum Al, silver Ag, or an alloy thereof, which has a low work function.

The display device according to the exemplary embodiment of the present invention may be a bottom-emission type in which light is emitted from the organic emission layer 134 in the direction of the substrate 110 or a top-emission type in which light is emitted from the organic emission layer 134 in the direction of the second electrode 136. The bottom-emission type display device is configured such that the first electrode 130 transmits light and the second electrode 136 has a thickness large enough to reflect light. On the other hand, the top-emission type is configured such that the first electrode 130 comprises a reflection layer made of aluminum Al, silver Ag, or nickel Ni and the second electrode 136 has a thickness small enough to cause light to be transmitted therethough; preferably, a thickness of 1 to 50 Å.

The second passivation film 140 covering the top of the second electrode 136 is positioned on the substrate 110 where the second electrode 136 is formed. Covering the top of the second electrode 136 refers to forming the second passivation film 140 along the step coverage of the second electrode 136. The second passivation film 140 functions to protect the elements disposed therebelow and prevent moisture from penetrating the organic emission layer 134, is made of at least one selected from the group consisting of a silicon nitride film, a silicon oxide film, and aluminum oxide, and has a single-layered or multi-layered structure thereof.

The organic insulating layer 170 is positioned on the second passivation film 140. As show in FIG. 4, the organic insulating film 170 is formed at a periphery of the emission area EA in such a shape as to surround the emission area EA. The emission area EA is an area in which light of the organic emission layer 134 is emitted through RGB subpixels to display an image. The organic insulating film 170 is positioned in a peripheral area other than the emission area EA, and prevents degradation of the transmittance of light emitted from the emission area EA. The organic insulating film 170 may be made of, but not limited to, an epoxy type monomer which has an excellent effect of preventing moisture or oxygen, and may be made of at least one selected from the group consisting of epoxy type, siloxane type, acrylic type, urethane type monomers, and combinations thereof.

The width w of the organic insulating film 170 surrounding the emission area EA of the display device 100 ranges from 1 to 30 mm. If the width w of the organic insulating film 170 is equal to or greater than 1 mm, moisture and oxygen penetrating from the outside of the display device 100 can be prevented. If the width w of the organic insulating film 170 is equal to or less than 30 mm, a bezel of the display device 100 can be prevented from being widened by the organic insulating film 170.

The thickness of the organic insulating film 170 ranges from 0.5 to 200 μm. If the thickness of the organic insulation film 170 is equal to greater than 0.5 μm, the organic insulating film 170 fills a gap in the second passivation film 140 caused by an impurity, and hence the second passivation film 14, which is to be formed later, is made uniform, thereby preventing penetration of moisture or oxygen. If the thickness of the organic insulating film 170 is equal to or greater than 200 μm, this prevents an increase in the processing time of the organic insulating film 170 and an increase in material costs.

As previously shown in FIG. 1, if a gap caused by an impurity is generated in an inorganic film, such as the second passivation film 140 or the second electrode 136, below the organic insulating film 170, the organic insulating film 170 in liquid form fills the gap and hence makes the second passivation film 140 uniform, thereby preventing penetration of moisture or oxygen. Also, the organic insulating film 170 is formed in such a shape as to surround the emission area EA of the display device 100, and hence acts like a dam for preventing moisture and oxygen penetrating from the outside of the display device 100.

The first passivation film 142 covering the organic insulating film 170 and the second passivation film 140 is positioned on the organic insulating film 170 and the second passivation film 140. The first passivation film 142 is made of the same material as the above-mentioned second passivation film 2, and capable of protecting the elements disposed therebelow and preventing penetration of oxygen and moisture from the outside.

The encapsulation substrate 160 is bonded onto the substrate 110 with the first passivation film 142 by a filling sealant. The filling sealant 165 serves to adhere the substrate 110 and the encapsulation substrate 160 to protect the elements disposed therein. The filling sealant 165 may be a material which has excellent adhesion characteristic and excellent light transmittance. For example, the filling sealant 185 may be made of a thermosetting or ultraviolet curing material, or may be made of epoxy type, acrylic type, imide type, or silane type material.

As above, the display device of the present invention has the advantage of preventing moisture and oxygen penetrating from the outside of the display device by forming an organic insulating film surrounding the emission area, and preventing penetration of moisture or oxygen as a gap caused by an impurity is filled with the organic insulating film to thus make the second passivation film uniform.

As shown in FIGS. 5 and 6, the display device according to the first exemplary embodiment of the present invention is configured such that the organic insulating film 170 covers part of the emission area EA. As show in FIG. 6, the organic insulating film 170 has a large width w so as to cover even the inside of the emission area EA. The larger the width w of the organic insulating film 170, the higher the effect of preventing moisture and oxygen penetrating from the outside. However, as the width w of the organic insulating film 170 becomes larger, the bezel of the display device becomes greater. Thus, in this exemplary embodiment, the organic insulating film 170 is formed to cover part of the emission area EA. Preferably, the organic insulating film 170 is formed to cover as small part of the emission area EA as possible so as not to degrade the transmittance of light emitted from the organic emission layer 134.

Figure 7:
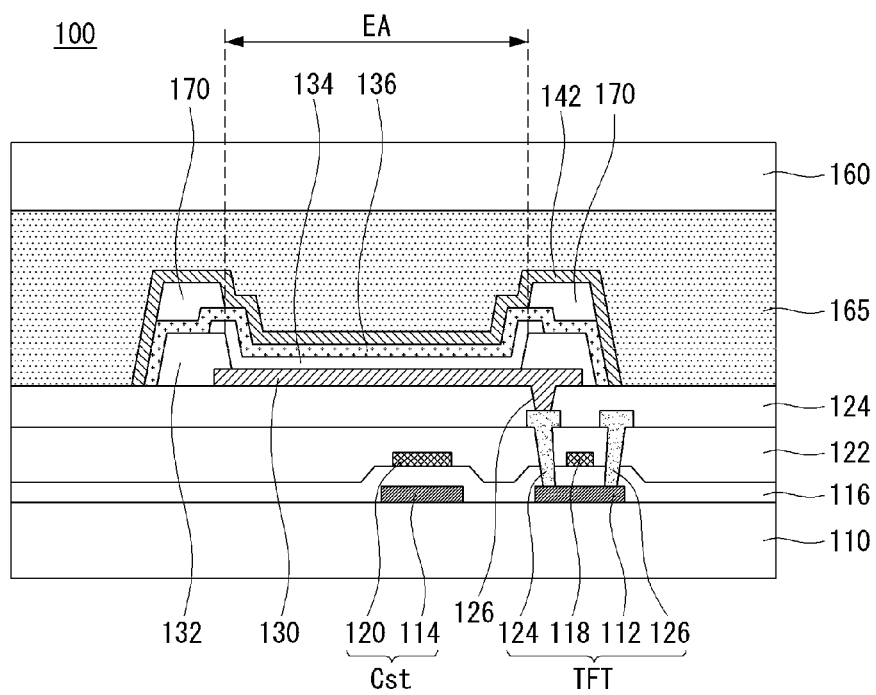
FIG. 7 is a cross-sectional view showing a display device according to a second exemplary embodiment of the present invention.

FIG. 7 is a cross-sectional view showing a display device according to a second exemplary embodiment of the present invention. In the following, the same components as those in the first exemplary embodiment are denoted by the same reference numerals, and description thereof are omitted.

As shown in FIG. 7, the display device according to the second exemplary embodiment comprises a substrate 110, a first electrode 130 positioned on the substrate 110, a second electrode 136, an organic emission layer 134 interposed between the first electrode 130 and the second electrode 136, an organic insulating film 170 positioned on the second electrode 136 and surrounding an emission area EA emitting light from the organic emission layer 134, and a first passivation film 142 covering the organic insulating film 170.

In particular, in the second exemplary embodiment of the present invention, the organic insulating film 170 contacting the second electrode 136 is formed on the second electrode 136, and the first passivation film 142 covering the organic insulating film 170 is formed. In the second exemplary embodiment of the present invention, the second passivation film of the previous first exemplary embodiment is omitted. Omitting the second passivation film has the advantage of improving the transmittance of light emitted from the organic emission layer 134, and helps to maintain the effect of preventing moisture and oxygen. Also, The display device according to the second exemplary embodiment of the present invention may be configured such that the organic insulating film 170 covers part of the emission area EA or not.

In the display device according to the second exemplary embodiment of the present invention, when an impurity is generated after the fabrication process of the second electrode 136, the organic insulating film 170 fills a gap caused by an impurity, and hence the first passivation film 142, which is to be formed later, is made uniform. Accordingly, the first passivation film 142 can be improved in the effect of preventing moisture and oxygen penetration.

Figure 8:
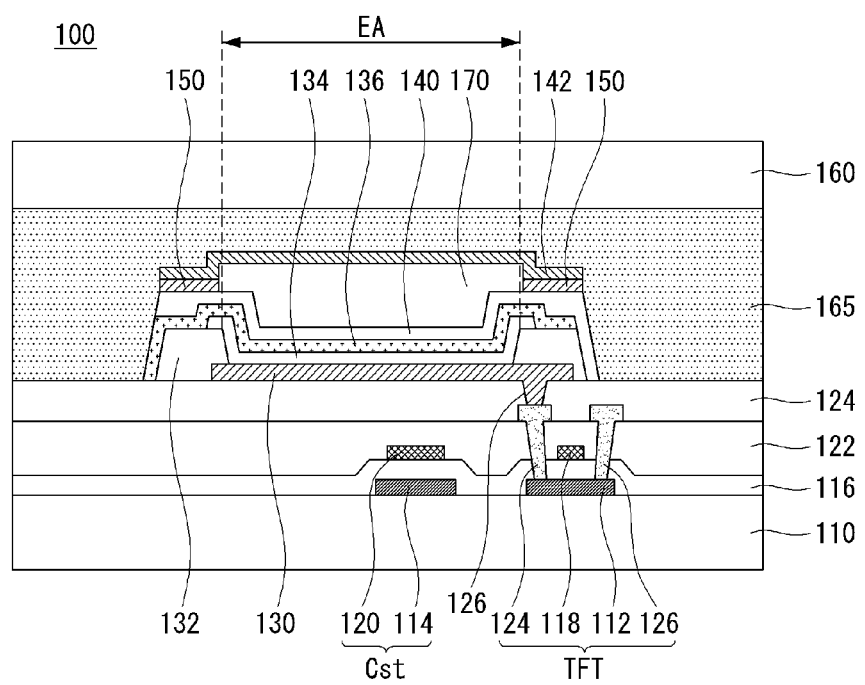
FIG. 8 is a cross-sectional view showing a display device according to a third exemplary embodiment of the present invention.
Figure 9:
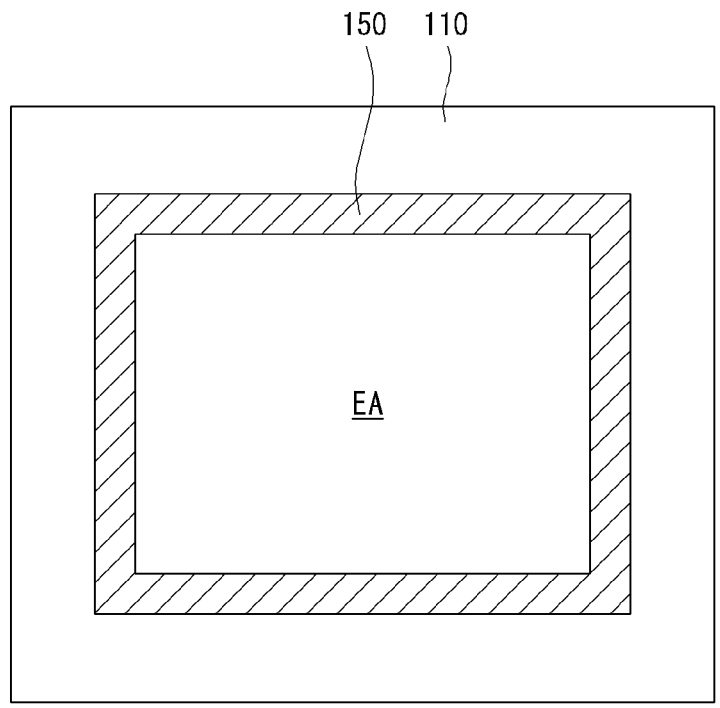
FIG. 9 is a top plan view showing the display device of FIG. 8.

FIG. 8 is a cross-sectional view showing a display device according to a third exemplary embodiment of the present invention. FIG. 9 is a top plan view showing the display device of FIG. 8. In the following, the same components as those in the first exemplary embodiment are denoted by the same reference numerals, and description thereof are omitted.

As shown in FIG. 8, the display device according to the third exemplary embodiment comprises a substrate 110, a first electrode 130 positioned on the substrate 110, a second electrode 136, an organic emission layer 134 interposed between the first electrode 130 and the second electrode 136, and a second passivation film 140 covering the second electrode 136.

In the third exemplary embodiment of the present invention, an organic insulating film 170 is positioned on the second passivation film 140. Unlike the previous first and second exemplary embodiments, the organic insulating film 170 is formed to cover an emission area EA emitting light. The organic insulating film 170 acts as an adhesion layer between the first passivation film 142 and the second passivation film 140 to thereby ensure the high-temperature and high-humidity reliability of the device.

A first passivation film 142 covering the organic insulating film 170 and the second passivation film 140 is positioned on the organic insulating film 170. The first passivation film 142 is made of the same material has the above-mentioned second passivation film 140, and capable of protecting the elements disposed therebelow and preventing penetration of oxygen and moisture from the outside.

The display device according to the third exemplary embodiment of the present invention further comprises a metal oxide film 150 formed between the first passivation film 142 and the second passivation film 140. More particularly, the metal oxide film 150 is formed on an interface on which the first passivation film 142 and the second passivation film 140 face each other. That is, the metal oxide film 150 contacting the first passivation film 142 is formed on the second passivation film 140, and the first passivation film 142 contacting the metal oxide film 150 is formed on the metal oxide film 150.

The metal oxide film 150 serves to buffer the unstable interface between the first passivation film 142 and the second passivation film 140. The first passivation film 142 and the second passivation film 140 are formed by a chemical vapor deposition method using plasma, such as PECVD. In the present invention, the second passivation film 140 is firstly formed by PECVD, the organic insulating film 170 is then formed in another chamber, and the first passivation film 142 is then formed by PECVD. Therefore, the interfacial characteristics between the first passivation film 142 and the second passivation film 140 are not good due to a discontinuous plasma process.

In the present invention, the metal oxide film 150 is formed on the second passivation film 140, which is to be in contact with the first passivation film 142, after the second passivation film 140 and the organic insulating film 170 are formed. The metal oxide film 150 is made of a metal oxide, such as an aluminum oxide, a magnesium oxide, or indium tin oxide, and is formed by a low-temperature film formation process such as sputtering, chemical vapor deposition, atomic layer deposition, facing target sputtering, etc. The metal oxide film 150 is formed with a thickness of 500 to 2000 µm, and buffers the interface between the first passivation film 142 and the second passivation film 140.

As shown in FIG. 9, the metal oxide film 150 is formed to surround the emission area EA emitting light from the organic emission layer 134, and is also formed in an area other than the emission area EA so as not to block the light emitted from the organic emission layer 134. An encapsulation substrate 160 is bonded onto the substrate 110 with the first passivation film 142 by a filling sealant.

As seen from above, the display device according to the third exemplary embodiment of the present invention can prevent defects such as bubbles, which may be generated between the first passivation film and the second passivation film, by forming a metal oxide film between the first passivation film and the second passivation film. Accordingly, there is the advantage of preventing moisture and oxygen penetrating from the outside of the display device by means of the interface between the first passivation film and the second passivation film.

Hereinafter, exemplary experimental examples will be disclosed to help understanding of the present invention. However, the exemplary examples are merely to explain the present invention, and not to limit the scope of the present invention.

Figure 1:
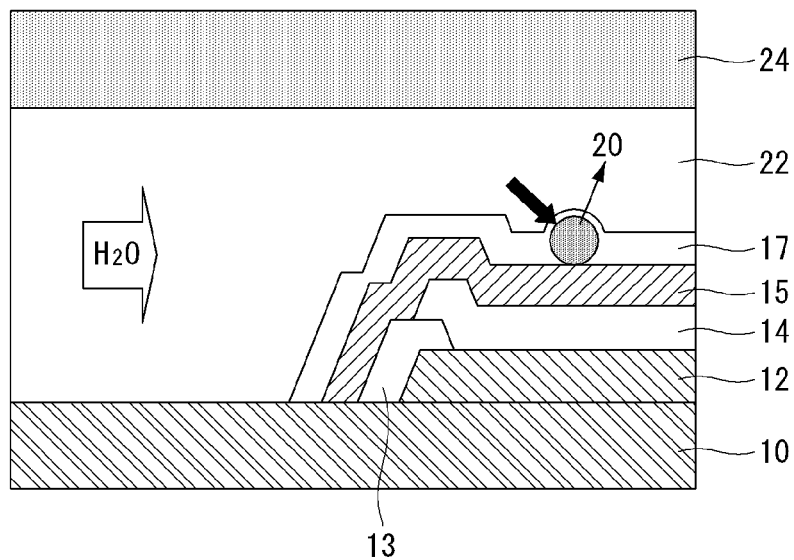
FIG. 1 is a cross-sectional view showing a conventional organic light emitting display.
Figure 2:
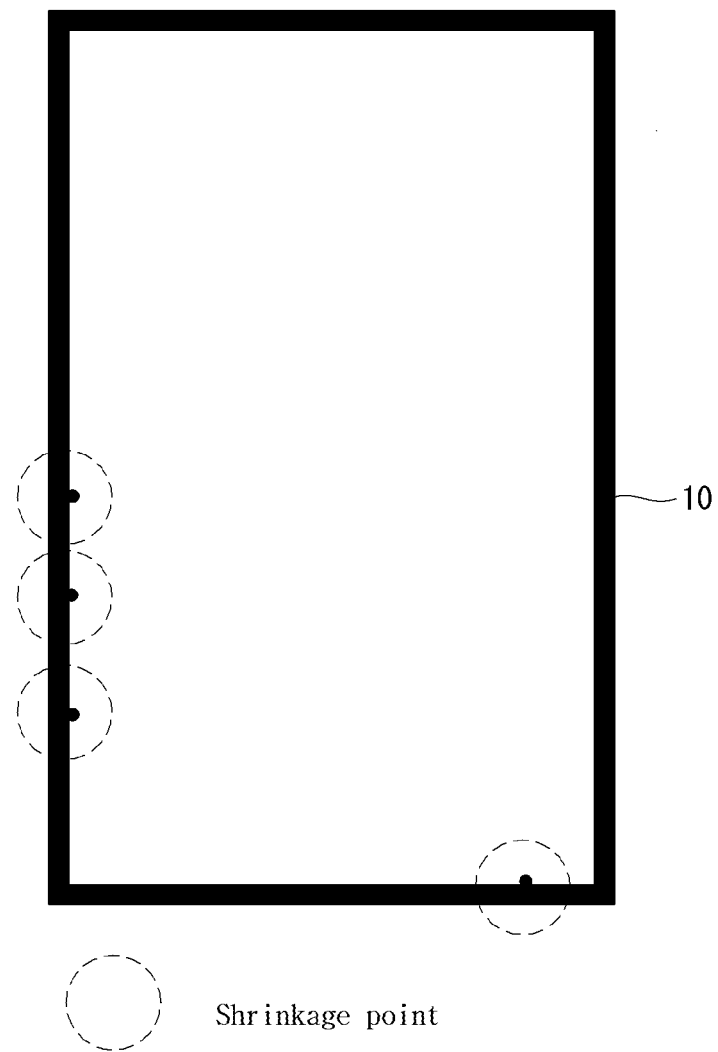
FIG. 2 is a top plan view showing an organic light emitting display which is shrunken.
Figure 10:
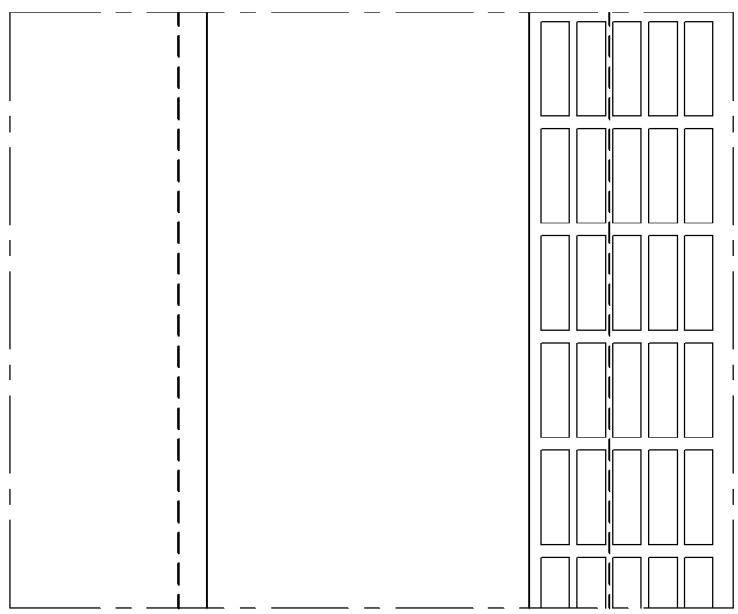
FIG. 10 is a view showing the left side of a display device with an organic insulating film.
Figure 11:
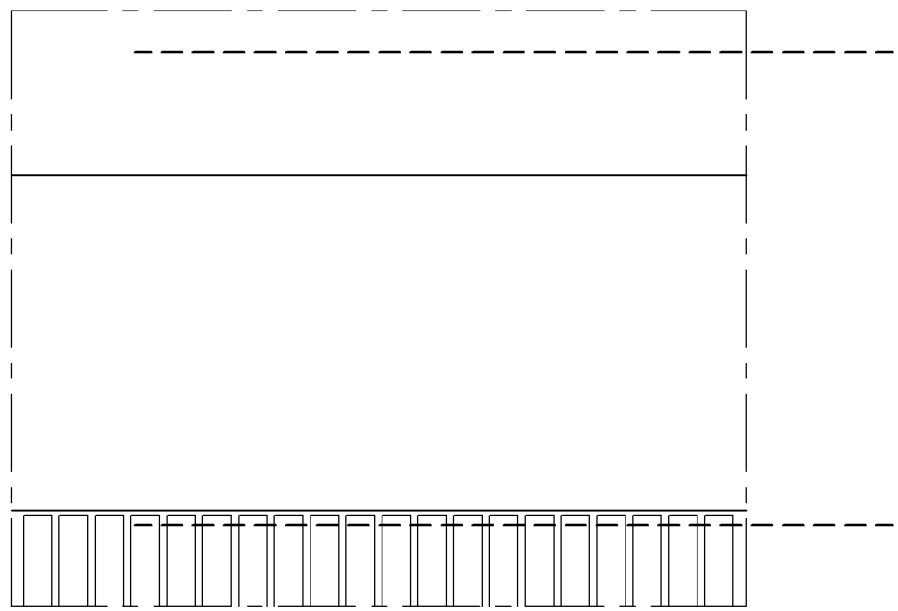
FIG. 11 is a view showing the top side of the display device.

<Exemplary Experimental Example 1>
Comparative Example 1
A display device having the above-described structure of FIG. 1 was fabricated. A passivation film was formed of a single-layered silicon nitride film with a thickness of 0.5 µm.
Example 1
A display device having the above-described structure of FIG. 5 was fabricated. A first passivation film was formed of a silicon nitride film with a thickness of 0.5 µm, and a second passivation film was formed of a silicon nitride film with a thickness of 1.5 µm. As shown in FIGS. 10 and 11, the thus-formed display device of the example was configured such that an organic insulating film (indicated by dotted line) covers part of an emission area where a plurality of pixels were formed.

A reliability test was conducted on the display devices fabricated according to Comparative Example 1 and Example 1, and the results were shown in the following Table 1. In the following reliability test, 30 panels were prepared for each of Comparative Example 1 and Example 1, and neglected for 100, 200, 300, 400, and 500 hours in an atmosphere of a temperature of 85° C. and a humidity of 85%.

TABLE 1

| | Number of operating panels (rate % of non-defective products) | |
|---|---|---|
| hours | Comparative Example | Example |
| 500 | 0 | 17 (56%) |
| 400 | 0 | 19 |
| 300 | 0 | 19 |
| 200 | 0 | 20 |
| 100 | 2 (6%) | 24 |

As shown in Table 1, in the display device according to Comparative Example 1 of the present invention, there was no panel at all that operated normally when the reliability test was conducted for 200, 300, 400, and 500 hours, and two panels operated normally when the reliability test was conducted for 100 hours. On the contrary, in the display device according to Example 1 of the present invention, it was confirmed that a minimum of 17 panels operated normally for each time range.

<Exemplary Experimental Example 2>
Comparative Example 2
A display device having the above-described structure of FIG. 8 was fabricated. A first passivation film was formed of a silicon nitride film with a thickness of 0.5 µm, an organic insulating film was formed of epoxy resin with a thickness of 10 µm, and a second passivation film was formed of a silicon nitride film with a thickness of 1.5 µm. And, a metal oxide film was formed of an aluminum oxide film with a thickness of 500 µm.
Comparative Example 2
A display device was fabricated without forming a metal oxide film under the same condition as the foregoing Example 2.

Figure 12:
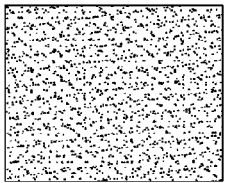
FIG. 12 is photographs of SEM and AFM measurements conducted on the display devices fabricated according to Comparative Example 2 and Example 2 of the present invention.
Figure 13:
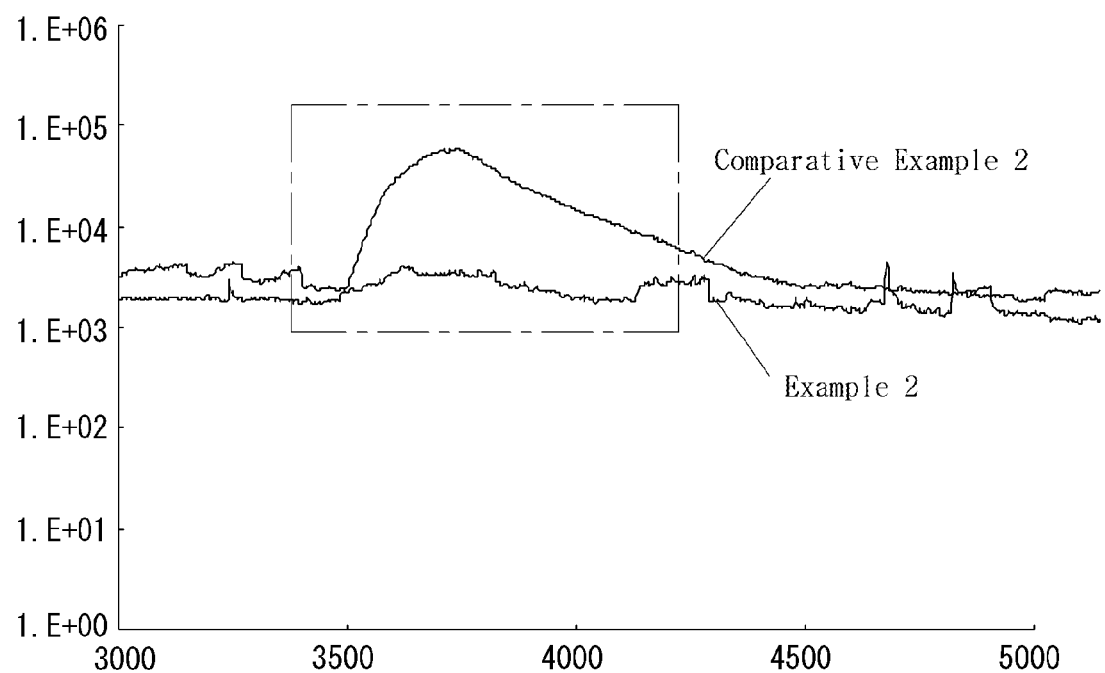
FIG. 13 is a graph showing the result of analysis of oxygen content in the display devices fabricated according to Comparative Example 2 and Example 2 of the present invention.

SEM and AFM measurement photographs of the display devices fabricated according to the foregoing Comparative Example 2 and Example 2 were shown in FIG. 12, and the result of analysis of oxygen content in the display devices fabricated according to Comparative Example 2 and Example 2 using a ToF-SIMS depth profile was shown in FIG. 13.

As shown in FIGS. 12 and 13, it was confirmed that the first passivation film and second passivation film with no metal oxide film according to Comparative Example 2 showed low surface roughness and high oxygen content was observed on the interface where the first passivation film and the second passivation film contact each other. On the contrary, it was confirmed that the first passivation film and second passivation film with a metal oxide film formed therebween according to Example 2 show good surface roughness and the oxygen content was significantly reduced in an area where the first passivation film and the second passivation film face each other.

As seen from above, the display devices according to the exemplary embodiments of the present invention can prevent moisture and oxygen penetrating from the outside of the display devices by forming an organic insulating film surrounding an emission area, and prevent penetration of moisture or oxygen because the organic insulating fills a gap caused by an impurity and hence makes passivation film uniform.

Moreover, the display devices according to the exemplary embodiments of the present invention can prevent defects such as bubbles, which may be generated between the first passivation film and the second passivation film, by forming a metal oxide film between the first passivation film and the second passivation film. Accordingly, there is the advantage of preventing moisture and oxygen penetrating from the outside of the display devices by means of the interface between the first passivation film and the second passivation film.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a substrate;
   a first electrode positioned on the substrate;
   a bank layer positioned on the first electrode to expose part of the first electrode and define a pixel;
   a second electrode;
   an organic emission layer interposed between the first electrode and the second electrode;
   an organic insulating film positioned on the second electrode and in a peripheral area other than an emission area emitting light from the organic emission layer;
   a passivation film covering the organic insulating film, and an encapsulation substrate bonded to the substrate wherein a filling agent is formed between the substrate and the encapsulation substrate to thus bond the substrate and the encapsulation substrate together
   wherein the organic insulating film is excluded from the emission area, and
   wherein the second electrode is interposed between the bank layer and the organic insulating film.

2. The display device of claim 1, wherein the width of the organic insulating film ranges from 1 to 30 mm.

3. The display device of claim 1, wherein the thickness of the organic insulating film ranges from 0.5 to 200 μm.

4. The display device of claim 1, wherein the organic insulating film is made of at least one selected from the group consisting of epoxy type, siloxane type, acrylic type, urethane type monomers, and combinations thereof.

5. The display device of claim 1, wherein the passivation film is made of at least one selected from the group consisting of a silicon nitride film, a silicon oxide film, and aluminum oxide.

6. A display device comprising:
   a substrate;
   a first electrode positioned on the substrate;
   a second electrode;
   an organic emission layer interposed between the first electrode and the second electrode;
   a second passivation film positioned on the second electrode;
   an organic insulating film positioned on the second passivation film and in a peripheral area other than an emission area emitting light from the organic emission layer;
   a first passivation film covering the second passivation film and the organic insulating film, and an encapsulation substrate bonded to the substrate wherein a filling agent is formed between the substrate and the encapsulation substrate to thus bond the substrate and the encapsulation substrate together
   wherein the organic insulating film is excluded from the emission area.

7. The display device of claim 6, wherein the width of the organic insulating film ranges from 1 to 30 mm.

8. The display device of claim 6, wherein the thickness of the organic insulating film ranges from 0.5 to 200 μm.

9. The display device of claim 6, wherein the organic insulating film is made of at least one selected from the group consisting of epoxy type, siloxane type, acrylic type, urethane type monomers, and combinations thereof.

10. The display device of claim 6, further comprising an encapsulation substrate bonded to the substrate,
    wherein a filling agent is formed between the substrate and the encapsulation substrate to thus bond the substrate and the encapsulation substrate together.

11. The display device of claim 6, wherein the first passivation film and the second passivation film are made of at least one selected from the group consisting of a silicon nitride film, a silicon oxide film, and aluminum oxide.

12. The display device of claim 6, further comprising a metal oxide film positioned between the first passivation film and the second passivation film.

13. The display device of claim 12, wherein an area between the first passivation film and the second passivation film corresponds to an area surrounding the emission area.

14. The display device of claim 12, wherein the metal oxide film contacting the first passivation film is positioned on the second passivation film, and the first passivation film contacting the metal oxide film is positioned on the metal oxide film.

* * * * *

UNITED STATES PATENT AND TRADEMARK OFFICE
CERTIFICATE OF CORRECTION

Page 1 of 1

PATENT NO.         : 8,786,180 B2
APPLICATION NO.    : 13/644845
DATED              : July 22, 2014
INVENTOR(S)        : Song et al.

It is certified that error appears in the above-identified patent and that said Letters Patent is hereby corrected as shown below:

On the Title Page:

Item [73] should read:

[73] Assignee: LG Display Co., Ltd., Seoul (KR)

Signed and Sealed this
Twenty-fifth Day of November, 2014

Michelle K. Lee
*Deputy Director of the United States Patent and Trademark Office*